United States Patent [19]
Torii et al.

[11] Patent Number: 5,101,369
[45] Date of Patent: Mar. 31, 1992

[54] DIGITAL FILTER CAPABLE OF SAMPLE RATE ALTERATION

[75] Inventors: Junji Torii; Akira Usui; Lenichi Takeuchi; Masamitsu Yamamura; Yusuke Yamamoto, all of Hamamatsu, Japan

[73] Assignee: Yamaha Corporation, Hamamatsu, Japan

[21] Appl. No.: 439,536

[22] Filed: Nov. 21, 1989

[30] Foreign Application Priority Data

Nov. 22, 1988 [JP] Japan .................. 63-295361
Nov. 22, 1988 [JP] Japan .................. 63-295362

[51] Int. Cl.⁵ ...................... G06F 15/31; H03M 7/46
[52] U.S. Cl. .............................. 364/724.11; 341/61
[58] Field of Search ............... 364/724.1, 723; 341/61

[56] References Cited

U.S. PATENT DOCUMENTS

| 4,825,398 | 4/1989 | Koch et al. | 364/724.1 |
| 4,870,661 | 9/1989 | Yamada et al. | 341/61 |
| 4,918,637 | 4/1990 | Morton | 364/724.1 |

FOREIGN PATENT DOCUMENTS 0076313 4/1987 Japan .................. 364/724.1

OTHER PUBLICATIONS

Bennett et al., "On the Characteristics of a Simple Architecture for Finite Impulse Digital Filtering", *IEEE Trans. on Computers*, vol. C-27, #12, pp. 1197-1202, Dec. 1978.

"Architecture and Instruction Set of a Programmable LSI Digital Filter" from the ICASSP 1983 Proceedings written by S. Terepin and Paul Loewenstein.

"Signal Synchronisation in Digital Audio" by W. T. Shelton, presented at the 76th Convention 1984 Oct. 8-11; Audio Engineering Society.

"ICs for Compact Disc Decoders" in the publication Electronic Components and Applications, vol. 4, No. 3, May 1982, pp. 131-141, by J. Matull.

"YM3623B" in Yamaha LSI; Yamaha Corporation, Printed in Japan, 1987; pp. 1-10.

"YM3414", in Yamaha LSI; Yamaha Corporation, printed in Japan, 1987; pp. 1-10.

*Primary Examiner*—Dale M. Shaw
*Attorney, Agent, or Firm*—Burns, Doane, Swecker & Mathis

[57] ABSTRACT

A digital filter performs a predetermined arithmetic operation on input digital data inputted thereto in time-series manner by the predetermined first sampling period to thereby generate output digital data corresponding to a second sampling frequency which is N (where N denotes an integral number) times larger than the predetermined first sampling frequency. This digital filter provides a synchronizing signal generating circuit and an operation control circuit. The synchronizing signal generating circuit detects the predetermined first sampling period of the input digital data to thereby generate a synchronizing signal having the second sampling frequency. The operation control circuit is activated by its internal clock which is asynchronous with the input digital data. This operation control circuit starts to perform its operation processes when the synchronizing signal is supplied thereto, thereafter it terminates the operation processes when a predetermined step number is completed.

5 Claims, 12 Drawing Sheets

DIGITAL FILTER CAPABLE OF SAMPLE RATE ALTERATION

BACKGROUND OF THE INVENTION

1. Field of the Invention

The present invention relates to a digital filter, more particularly to an oversampling digital filter which is used for a digital audio system.

2. Prior Art

The conventional digital signal processing circuit uses the system clock to thereby carry out the digital signal processing, wherein the system clock has the period which is obtained by dividing the input sampling period by the specific step number. Hereinafter, description will be given with respect to the digital filter (i.e., oversampling filter) as an example of the conventional digital signal processing circuit, wherein such digital filter is used in the digital audio device such as the compact disk (CD) player, broadcasting satellite (BS) receiver, digital audio tape recorder (DAT) etc.

In the digital filter, the input digital signal is resampled by the frequency which is N times (where N denotes the integral number) larger than the sampling frequency thereof, and then it is outputted. Thereafter, the digital signal having high sampling frequency which is outputted from the digital filter is subject to the digital-to-analog (D/A) conversion, by which it is possible to obtain the analog signal in which the audio signal band is sufficiently apart from the unnecessary higher harmonic band. Therefore, such unnecessary higher harmonics of the analog signal outputted from the D/A converter can be easily removed by the low-pass filter. Thus, it is possible to reproduce the audio signal having good quality.

FIGS. 13A, 13B are block diagrams showing the configuration of the audio signal reproducing circuit for the CD player which uses the conventional digital filter.

In FIG. 13A, 1 designates a signal processing circuit. As the integrated circuit (IC) of this circuit, "YM3623B" produced by YAMAHA Corporation is known, for example. The pit information read from the CD is digitized in the signal processing circuit 1. This signal processing circuit 1 outputs digital data SDI corresponding to the pit information by every predetermined sampling period FW=1/fs in serial manner. In addition, this circuit 1 also outputs bit clock BCI synchronizing with each bit data of SDI, and it further outputs word clock SDSY by every sampling period FW.

In addition, 2 designates a digital filter, whose IC is known as "YM3414" produced by YAMAHA Corporation, for example. This digital filter 2 inputs the digital data SDI from the signal processing circuit 1 by the timing corresponding to the bit clock BCI. Herein, the digital data SDI is configured by 16 bits as one word. Then, one word data for left (L) channel is fed to the digital filter 2 while the word clock SDSY is at "1". On the other hand, another word data for right (R) channel is fed to the digital filter 2 while SDSY is at "0". By detecting the change in the level of the word clock SDSY, the digital filter 2 detects the change-over point of the word length of SDSY. Thus, the digital filter 2 inputs the digital data SDI of one word for R channel and another SDI of one word for L channel.

As described above, the digital filter 2 inputs the digital data SDI by every sampling period FW. Thereafter, the digital filter 2 performs the arithmetic operation to thereby obtain the digital data corresponding to the sampling frequency 8 fs which is eight times larger than the input sampling frequency fs. Such digital data is sequentially and serially outputted as digital data DRO (for right channel), DLO (for left channel) by every frequency which is one-eight longer than the input sampling frequency FW. Then, the digital filter 2 outputs an output bit clock BCO synchronizing with each bit data of the digital data DRO, DLO, and it also outputs an output word clock WCO and a sample/hold signal SHL synchronizing with the timing when the digital data DRO, DLO are sent. This digital filter 2 provides an oscillator circuit 2X having an oscillation frequency which is around 400 fs. The output of this oscillator circuit 2X is subject to the phase synchronization so that the internal clock is generated. Based on this internal clock, several parts of the digital filter 2 operate. In other words, the processing of the digital filter 2 is performed with the signal processing circuit 1 in phase-synchronized manner.

In FIG. 13A, 3R, 3L designate digital-to-analog (D/A) converters each of which converts the digital data DRO, DLO from the digital filter 2 into analog signals. The digital data DRO, DLO are serially inputted into the D/A converters 3R, 3L by the bit clock BCO. At the changing point of the word clock WCO, the digital data is latched by an internal latch circuit (not shown) built in the D/A converter so that it is subject to the D/A conversion. Thus, the digital data DRO, DLO are converted into analog signals AR, AL, which are respectively fed to sample/hold circuits 4R, 4L. Therefore, these analog signals AR, AL are subject to the sample/hold operation, and then the unnecessary higher harmonics are removed from them by analog filters 5R, 5L. Finally, the analog filters 5R, 5L respectively output an audio signal RA for R channel and another audio signal LA for L channel.

Incidentally, the circuit shown in FIG. 13A can be partially modified as shown in FIG. 13B. More specifically, in FIG. 13B, a high speed clock Ca generated from the signal processing circuit 1 is supplied to an input terminal XI for oscillator circuit of the digital filter 2. By use of the configuration of FIG. 13B, it is also possible to configure the audio signal reproducing circuit having the same function of FIG. 13A.

In the above-mentioned conventional digital filter 2, its circuit design is made based on the input timing specifications such as the bit clock number (which is called as "bit clock rate") which is inputted by every input sampling frequency fs and by every sampling period FW. The sampling frequency fs of the digital signal varies depending on the system. For example, fs is at 32 kHz in the BS receiver, 44.1 kHz in the CD player and 48 kHz in the DAT. In addition, several kinds of bit clock rates are used, wherein the bit clock rate ranges from 32 fs to 192 fs, for example. Therefore, in order to design the digital audio system, it is necessary to prepare the specific digital filter corresponding to the input timing specifications. For this reason, there is a disadvantage in that the circuit design must be difficult. In the case where the desirable digital filter is not available, it is necessary to newly purchase or newly develop the desirable digital filter, which makes the cost for the system higher. Further, the conventional digital filter requires the high speed clock which corresponds to the signal processing circuit 1 in phase-synchronized manner. Accordingly, there is a problem in that the conventional digital filter requires the high interface technology.

SUMMARY OF THE INVENTION

Accordingly, it is a primary object of the present invention to provide a digital filter whose system clock is fixed but which can be applied to several kinds of the input timing specifications.

In a first aspect of the present invention, there is provided a digital signal processing circuit which performs a specific step number of operation processes by a predetermined sampling period comprising:

(a) detecting means for detecting an input signal indicative of the sampling period to thereby start to perform the operation processes; and (b) control means for terminating the operation processes when the specific step number is completed.

In a second aspect of the present invention, there is provided a digital filter which performs a predetermined arithmetic operation on input digital data inputted thereto in time-series manner by a predetermined first sampling period to thereby generate output digital data corresponding to a second sampling frequency which is N (where N denotes an integral number) times larger than a predetermined first sampling frequency comprising:

(a) a synchronizing signal generating circuit for generating a synchronizing signal having the second sampling frequency responsive to the predetermined first sampling period of the input digital data inputted thereto; and (b) an operation control circuit activated by its internal clock which is asynchronous with the input digital data, the operation control circuit starting to perform operation processes responsive to the synchronizing signal supplied thereto, thereafter the operation control circuit terminating the operation processes upon a completion of a predetermined step number.

In a third aspect of the present invention, there is provided a digital filter which performs an arithmetic operation on input digital data inputted thereto in time-series manner by a predetermined first sampling period to thereby generate output digital data corresponding to a second sampling frequency which is N (where N denotes an integral number) times larger than a predetermined first sampling frequency comprising:

(a) a timing generating circuit for detecting the first sampling period of the input digital data to thereby generate a start signal having the second sampling frequency;

(b) a detecting circuit for detecting a bit input speed of each bit within the input digital data; and (c) an output circuit activated by the start signal for outputting the output digital data and a synchronizing signal, wherein output timings of the output digital data and the synchronizing signal are controlled based on the bit input speed.

In a fourth aspect of the present invention, there is provided a digital filter comprising:

(a) serial-to-parallel converting means for converting first serial data inputted thereto into first parallel data, the first serial data having a predetermined sampling frequency;

(b) synchronizing signal generating means for generating a synchronizing signal having N times (where N denotes an integral number) larger frequency than the sampling frequency based on the first serial data;

(c) operation means activated based on a clock which is asynchronous with the first serial data for calculating the parallel data by corresponding coefficient to thereby generate second parallel data indicative of its operation result in response to the synchronizing signal; and (d) parallel-to-serial converting means for converting the second parallel data into second serial data corresponding to the frequency which is N times larger than the sampling frequency.

BRIEF DESCRIPTION OF THE DRAWINGS

Further objects and advantages of the present invention will be apparent from the following description, reference being had to the accompanying drawings wherein a preferred embodiment of the present invention is clearly shown.

In the drawings.

DESCRIPTION OF A PREFERRED EMBODIMENT

[A] Configuration of Digital Filter

Figure 1:
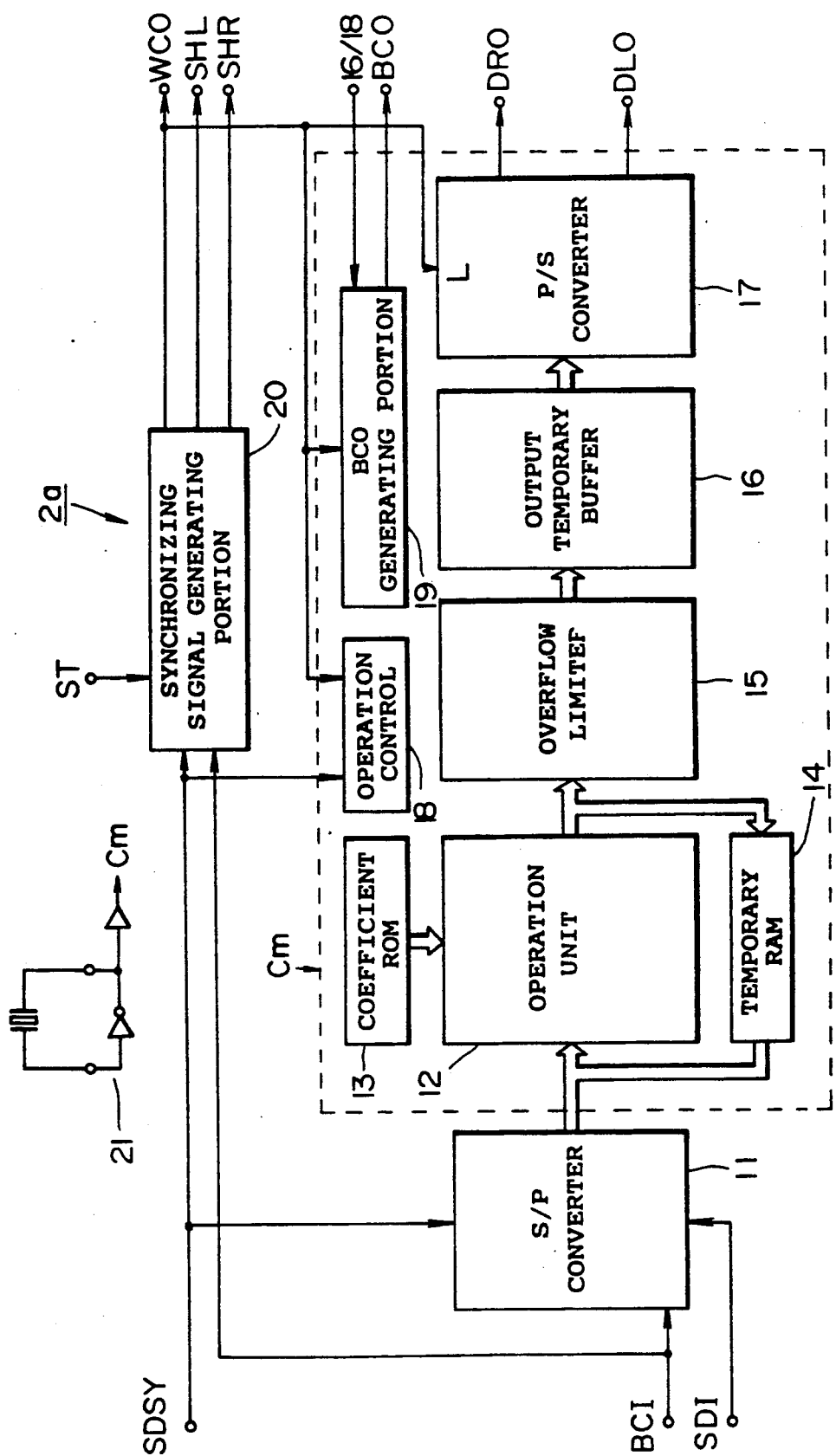
FIG. 1 is a block diagram showing the configuration of the digital filter according to an embodiment of the present invention.
Figure 2:
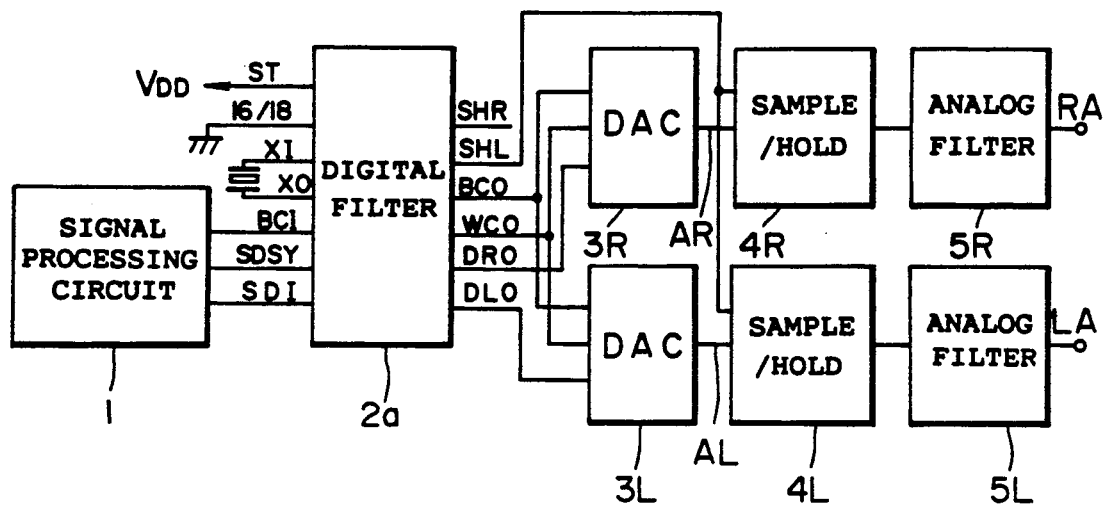
FIGS. 2A, 2B are block diagrams each showing the audio signal reproducing circuit which employs the digital filter shown in FIG. 1.
Figure 2:
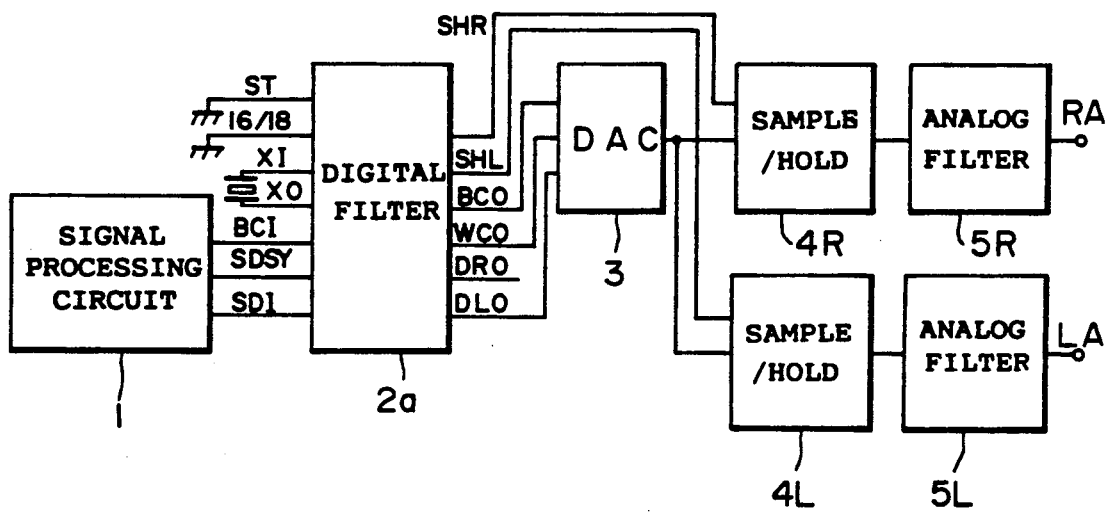
Figure 13A:
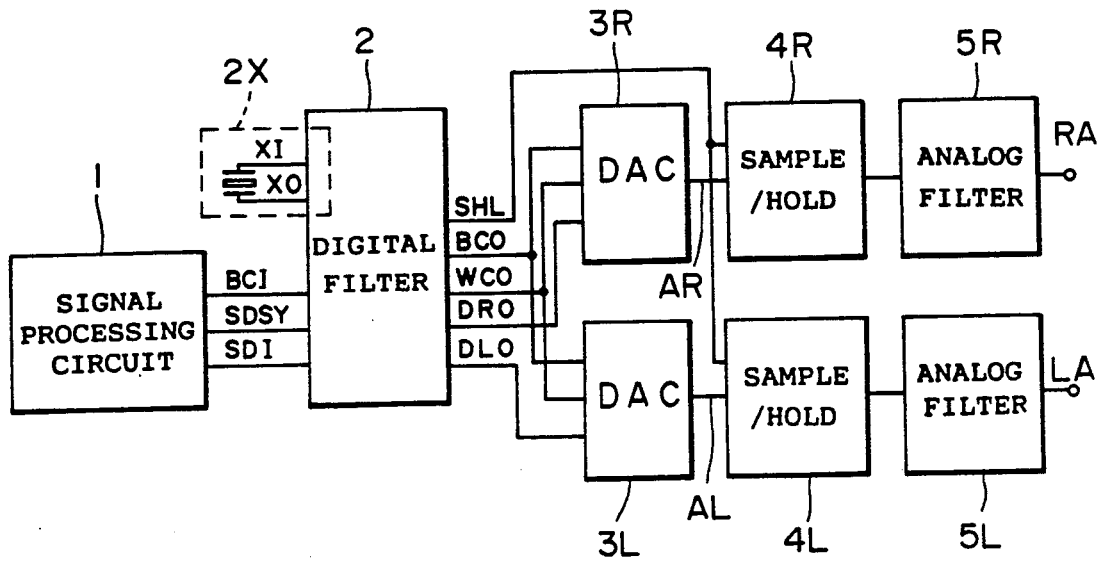
FIGS. 13A, 13B are block diagrams showing the configuration of the audio signal reproducing circuit employing the conventional digital filter.
Figure 13B:
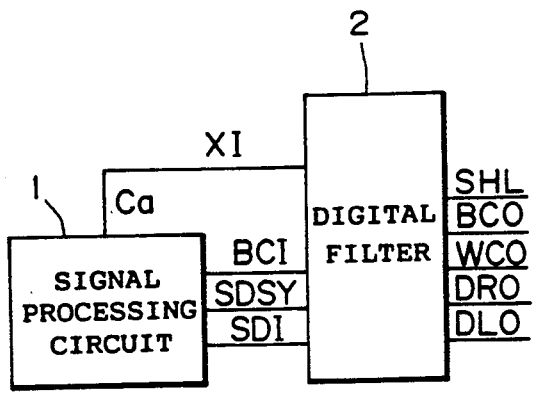

FIG. 1 is a block diagram showing a digital filter 2a according to an embodiment of the present invention. FIG. 2A is a block diagram showing the configuration of the audio signal reproducing circuit according to 2DAC-system which employs the digital filter 2a, while FIG. 2B is a block diagram showing the configuration of another audio signal reproducing circuit according to the 1DAC-system which also employs the digital filter 2a. In FIGS. 2A, 2B, the parts similar to those of FIGS. 13A, 13B are labeled with the same legends.

In FIG. 1, 11 designates a serial/parallel (S/P) converter. Each bit of the serial data SDI supplied from the signal processing circuit 1 (see FIGS. 2A, 2B) by every sampling period FW is read by the S/P converter 11 by the timing of bit clock BCI. Every time the word clock SDSY is changed over, the serial data SDI of sixteen bits is outputted as one word parallel data. In addition, 12 designates an operation unit which is configured by a shift register, a multiplier and an adder (not shown). The parallel data outputted from the S/P converter 11 is supplied to the shift register wherein bits thereof are sequentially shifted. Then, the digital data stored in each stage of the shift register is multiplied by a coefficient read from a coefficient read-only memory (ROM)

13. Thereafter, the multiplication results are added together, resulting that the digital data corresponding to the frequency which is N times larger than the sampling frequency is generated. Further, 14 designates a temporary random-access memory (RAM) which stores halfway result of the operation executed in the operation unit 12.

Next, 15 designates an overflow limiter which functions to limit the operation result obtained in the operation unit 12 into the predetermined value range when the operation result is extremely larger than the realistic value. 16 designates an output temporary buffer. Therefore, the digital data obtained through the operation process of the operation unit 12 is fed and then temporarily stored in this output temporary buffer 16 via the overflow limiter 15. 17 designates a parallel/serial (P/S) converter which converts the parallel data outputted from the output temporary buffer 16 into the serial data DRO, DLO.

Next, 18 designates an operation control which controls the operation process in the operation unit 12 and the data transmission among several parts in the circuit shown in FIG. 1. 19 designates a BCO generating portion which generates the output bit clock BCO. This BCO is outputted in synchronism with the sending timing of each of the bits of the serial data DRO, DLO outputted from the P/S converter 17. Therefore, the D/A converters 3, 3R, 3L (see FIGS. 2A, 2B) to be coupled to this digital filter 2a can input the serial data DRO, DLO by this output bit clock BCO. Incidentally, this digital filter is designed such that its operation result can be outputted as 16-bit digital data or 18-bit digital data. In this case, 16-bit digital data is designated when the change-over signal (16/18) (which selects one of 16-bit and 18-bit digital data) is at "0", while 18-bit digital data is designated when the change-over signal is at "1". The number of output bit clocks BCO depends on the above-mentioned designation made by the change-over signal.

Next, 20 designates a synchronizing signal generating portion which detects the sampling frequency fs based on the input word clock SDSY and input bit clock BCI. Based on such detection result, this portion 20 generates the synchronizing signal having the frequency which is eight times larger than the sampling frequency fs. Then, the operation control 18 is activated by this synchronizing signal. In addition, the synchronizing signal generating portion 20 generates the output word clock WCO and sample/hold signals SHL, SHR which are synchronous with one word of the serial data DRO, DLO. In FIG. 2A, the D/A converters 3R, 3L detect the leading edge of the output word clock WCO to thereby latch the inputted serial data DRO, DLO. Same thing can be said for the D/A converter 3 shown in FIG. 2B. The sample/hold circuits 4R, 4L carry out the sample/hold operations on the analog outputs of the D/A converters 3R, 3L in accordance with the sample/hold signals SHR, SHL respectively. Herein, the digital filter 2a fixes the change-over signal ST at "1" in the 2DAC-system shown in FIG. 2A, while it fixes ST at "0" in the 1DAC-system shown in FIG. 2B. Thus, it is possible to obtain the sample/hold signal which is suitable for the operation of each system.

In FIG. 1, 21 designates a crystal oscillator wherein a crystal vibrator is externally connected between terminals XI, XO. The present embodiment selects the frequency (larger than 384 fs, for example) which is sufficiently larger than the sampling frequency fs of the input digital data as the oscillation frequency of the crystal oscillator 21. In FIG. 1, the operation unit 12, coefficient ROM 13, temporary RAM 14, overflow limiter 15, output temporary buffer 16, P/S converter 17, operation control 18 and BCO generating portion 19 surrounded by the dotted line operate in accordance with an oscillation output Cm of the crystal oscillator 21.

[B] Operation of Digital Filter

Figure 3:
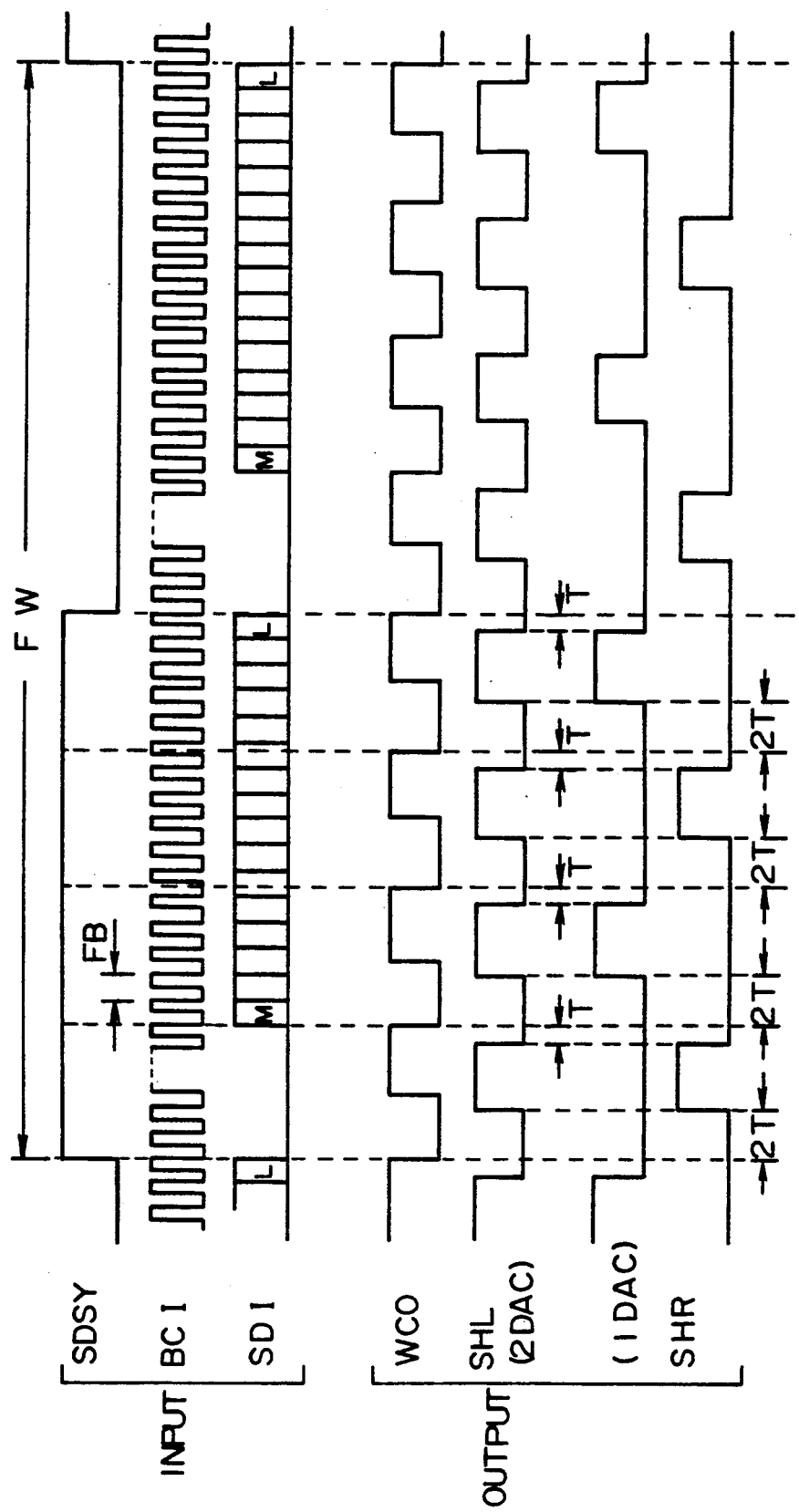
FIGS. 3, 4 are time charts for explaining the operation of the digital filter.

Next, diagrammatical description will be given with respect to the operation of the digital filter by use of a time chart shown in FIG. 3. The signal processing circuit 1 as shown in FIGS. 2A, 2B outputs the bit clock BCI having the period FB and also outputs the word clock SDSY, 16-bit serial data SDI for L channel, R channel by every sampling period FW (=1/fs), which are supplied to the digital filter 2a. Herein, the data SDI for L channel is fed to the digital filter when the word clock SDSY is at "1", while another data SDI for R channel is fed to the digital filter when SDSY is at "0". Such serial data SDI is fed to the S/P converter 11. At the changeover timing of the word clock SDSY, the serial data is converted into the parallel data.

Meanwhile, the synchronizing signal generating portion 20 detects the leading edge of the word clock SDSY. In addition, this portion 20 also detects the bit number of the bit clock BCI to be inputted thereto during one sampling period FW. Based on such detection result, the synchronizing signal generating portion 20 generates the output word clock WCO having the frequency which is eight times larger than the input sampling frequency fs as shown in FIG. 3. In addition, the sample/hold signal SHL, SHR which is synchronous with this WCO is generated. When the leading edge of this output word clock WCO is detected by the operation control 18, the operation control 18 sends the micro program address so that the micro program is executed in the operation unit 12. After the predetermined step number of micro programs are completed, the operation unit 12 is in the standby state until the operation control 18 detects the trailing edge of the output word clock WCO. The above-mentioned processes executed by the operation control 18 and operation unit 12 are executed in synchronism with the internal clock Cm. The operation process is executed by every trailing edge of the word clock WCO. Therefore, in one sampling period FW, eight digital data are obtained for L channel and R channel respectively. These data are sent to the P/S converter 17 via the overflow limiter 15 and output temporary buffer 16. Then, the total sixteen data are sent with the word clock WCO. In synchronism with the output bit clock BCO in the BCO generating portion 19, each bit of such digital data is outputted so that the serial data DLO, DRO are outputted.

In FIG. 2A, the D/A converters 3R, 3L performs the D/A conversion on the input digital data at the trailing edge of the word clock WCO. The sample/hold circuit 4R, 4L is in the sampling state when the sample/hold signal SHR, SHL is at "1", while 4R, 4L is in the hold state when SHR, SHL is at "0". In the digital filter, the sample/hold signal SHR, SHL is at "0" at the trailing edge of the word clock WCO as shown in FIG. 3. Then, after the predetermined time 2T is passed, the sample/hold signal SHR, SHL rises up at "1". For this reason, the sampling operation is carried out by the sample/hold circuit 4R, 4L after the D/A conversion is completed and the analog signal AR AL becomes sufficiently stable.

Figure 4:
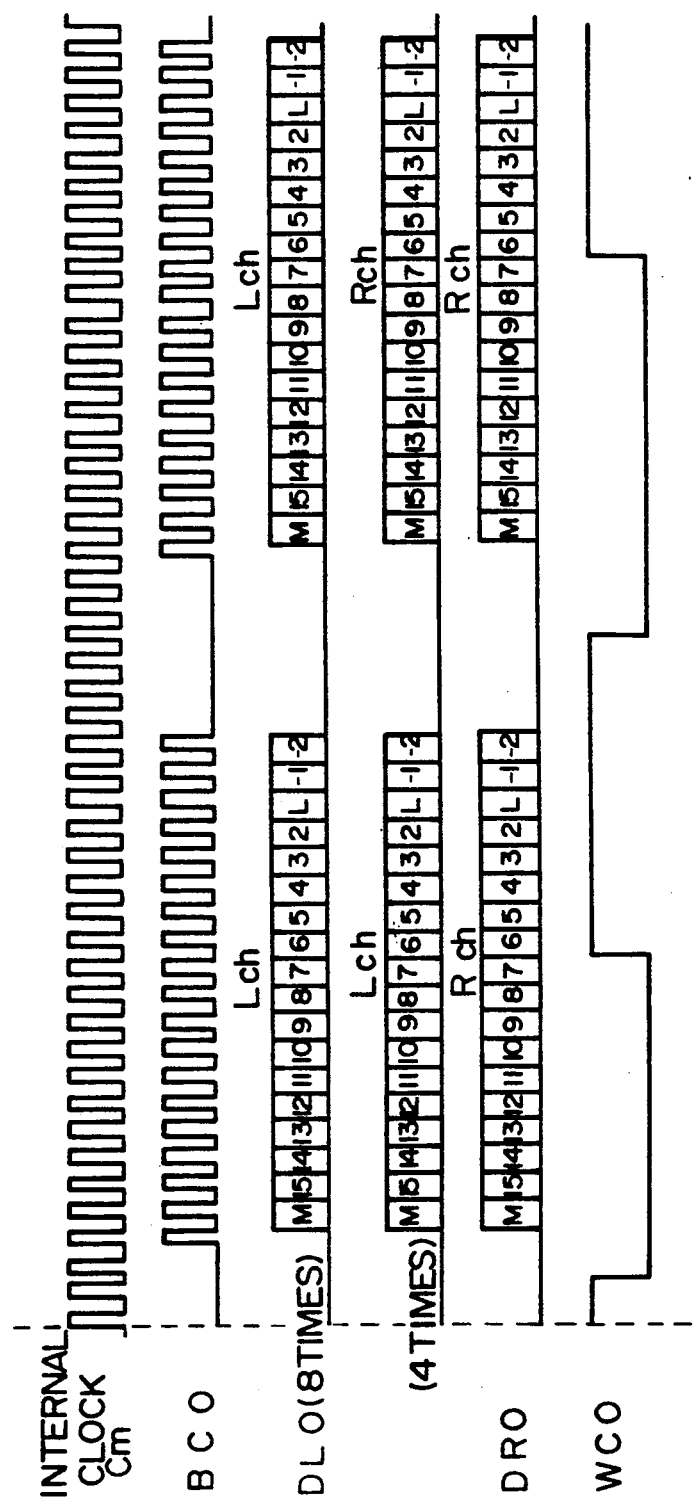

FIG. 4 is a time chart showing the relation between the internal clock Cm and output signals of the digital filter. When the trailing edge of the output word clock WCO is detected, the BCO generating portion 19 generates the bit clock BCO synchronizing with the internal clock Cm. This digital filter 2a outputs the 18-bit digital data as its operation result, which is outputted as the serial data DLO, DRO. Herein, all bits of the serial data are sequentially outputted from its most significant bit (MSB; see "M" in FIG. 4) to its least significant bit (LSB; see "L" in FIG. 4). Thereafter, the digital filter outputs the extension bits (e.g., "−1", "−2" shown in FIG. 4) which are obtained by its operation result. On the other hand, in the case where the digital system to be coupled to the digital filter 2a is the 16-bit system, such two extension bits are not required. Therefore, the present digital filter 2a can be applied to both of the 18-bit and 16-bit systems by changing the number of bit clocks BCO. More specifically, the number of bit clocks BCO is designated by the level of the foregoing changeover signal (16/18), so that the BCO generating portion 19 will output the designated number of bit clocks.

Figure 5A:
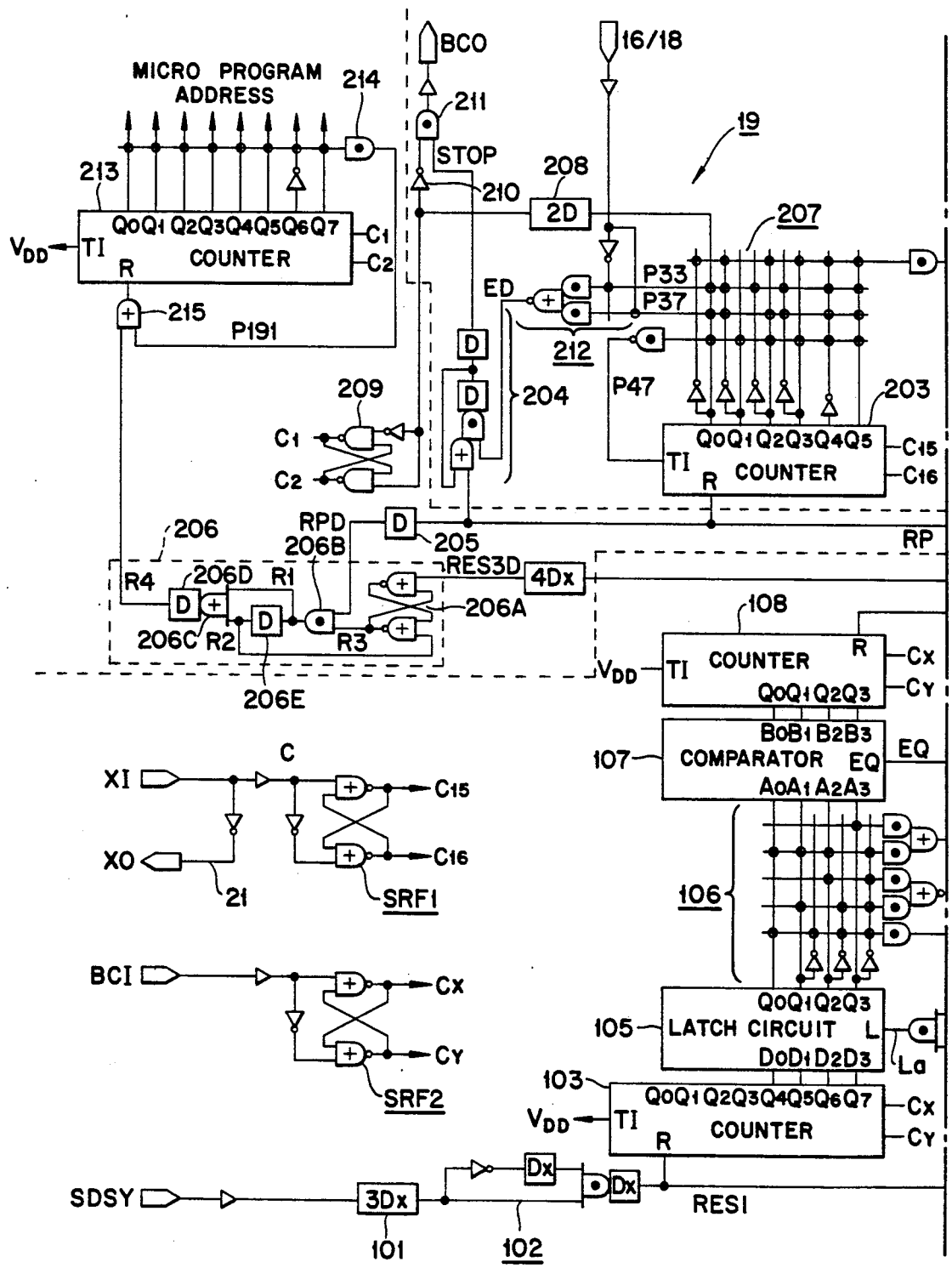
FIGS. 5a and 5b are collectively referred to herein as FIG. 5 and illustrate a circuit diagram showing the detailed configurations of several parts in the digital filter shown in FIG. 1.
Figure 5B:
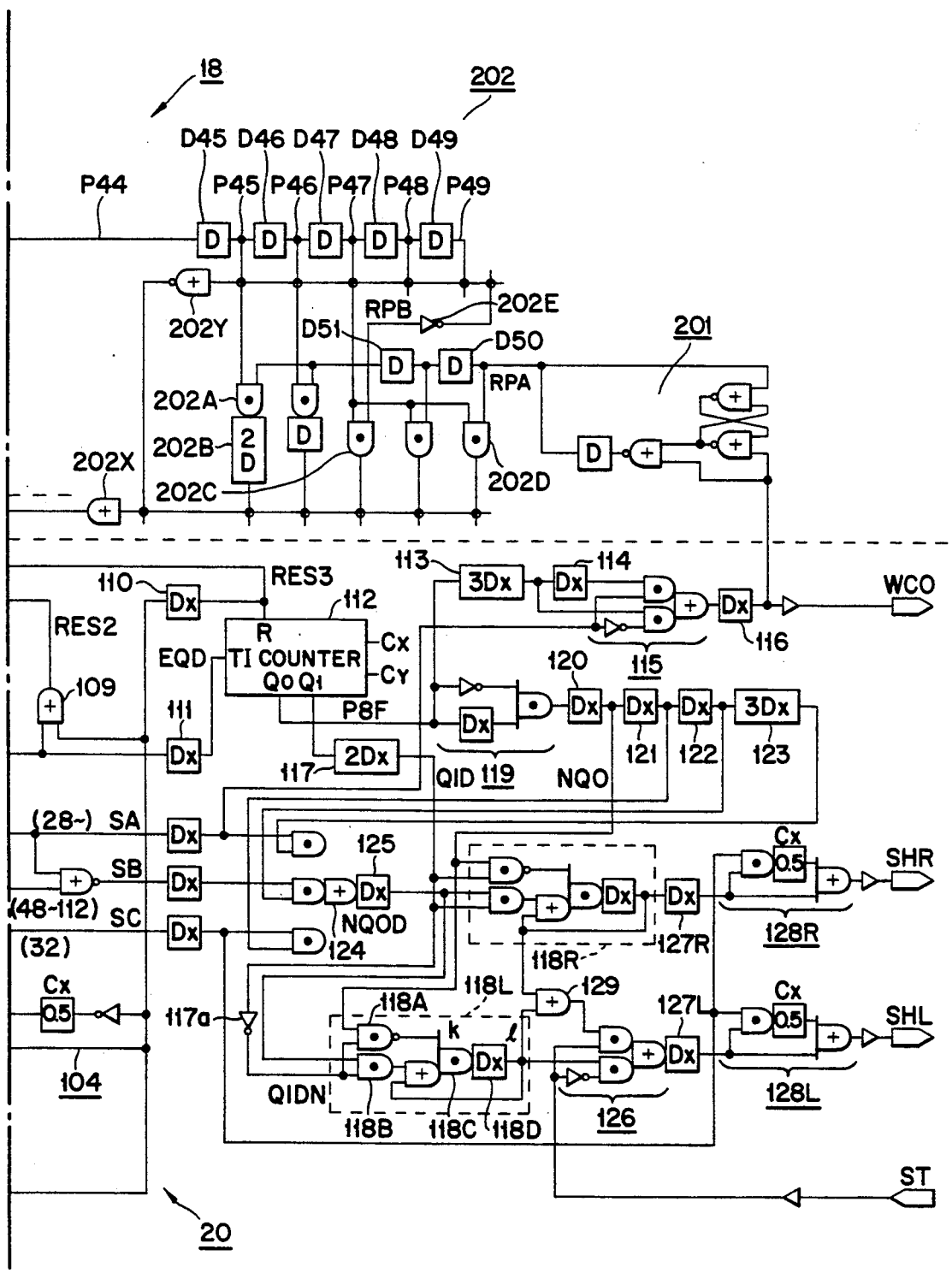

Next, description will be given with respect to the timing control of the digital filter 2a. FIG. 5 is a circuit diagram showing the partial configuration of the operation control 18, BCO generating portion 19 and synchronizing signal generating portion 20.

This circuit shown in FIG. 5 includes the circuit portion which operates in synchronism with the internal clock Cm generated from the crystal oscillator 21 and another circuit portion which operates in synchronism with the input bit clock BCI.

In addition, the circuit shown in FIG. 5 is to be configured as the IC, so that it adopts the specific circuit design by which the stable operation of the IC can be obtained. Therefore, supplementary description will be given with respect to this circuit design for IC. As the flip-flops used in the circuit shown in FIG. 5, the master-slave flip-flop is employed. This master-slave flip-flop is driven by the 2-phase clock which is generated from the foregoing internal clock Cm or bit clock BCI. In FIG. 5, SRF1, SRF2 designate circuits which respectively generate 2-phase clock C15, C16 and another 2-phase clock Cx, Cy.

Figure 6:
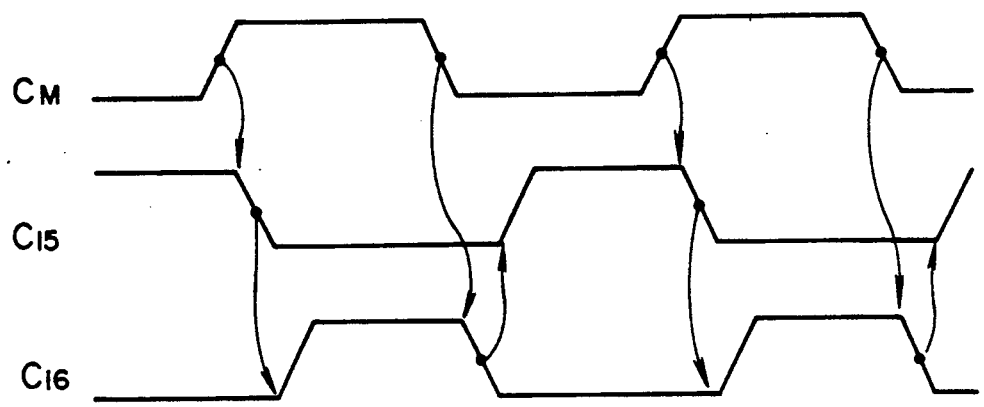
FIG. 6 is a time chart for explaining the operation of the clock generating circuit shown in FIG. 5.

FIG. 6 is a time chart showing the operation of the circuit SRF1. As shown in FIG. 6, the clocks C15, C16 immediately falls down when the clock Cm is changed. Herein, the clock C15 rises up when C16 falls down, while the clock C16 rises up when C15 falls down. Therefore, the phase relation between the clocks C15, C16 are set such that "1" level period of C15 does not overlap with that of C16. For this reason, these clocks C15, C16 work as the 2-phase clock having good quality. Similar to the above-mentioned circuit SFR1, the circuit SFR2 also generates the 2-phase clock Cx, Cy.

Figure 7:
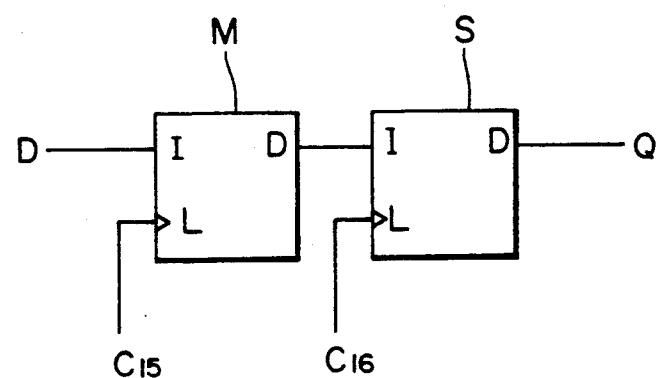
FIG. 7 is a view for explaining the method of supplying 2-phase clocks to the flip-flop used in the circuit shown in FIG. 5.

As shown in FIG. 7, such clocks C15, C16 in the 2-phase clock are respectively supplied to a master-side latch M and a slave-side latch S which configures the flip-flop used in the circuit shown in FIG. 5. Since the clocks are fed to the flip-flop as described above, the slave-side latch S is certainly set in the breaking state when the master-side latch M reads data therein. On the other hand, when the slave-side latch S reads data therein, the master-side latch M is certainly set in the breaking state. Accordingly, it is possible to obtain the stable flip-flop operation.

In addition, the circuit shown in FIG. 5 also uses a delay circuit configured by the master-slave flip-flop in order to adjust the timing. Actually, this delay circuit is indicated by "D", "nD" (where n denotes an integral number), "Dx" or "nDx" in FIG. 5. Herein, the delay circuit "D" or "nD" is activated by the 2-phase clock C15, C16. In addition, another delay circuit "Dx" or "nDx" is activated by the 2-phase clock Cx, Cy. Further, the integral number "n" indicates the stage number of the flip-flop. This concludes the supplementary description with respect to the circuit shown in FIG. 5.

[C] Detailed Description of Each Part Shown in FIG. 5

Next, detailed description will be given with respect to the configurations and operations of the synchronizing signal generating portion 20, BCO generating portion 19 and operating control 18 respectively.

(1) Synchronizing Signal Generating Portion 20

Figure 8:
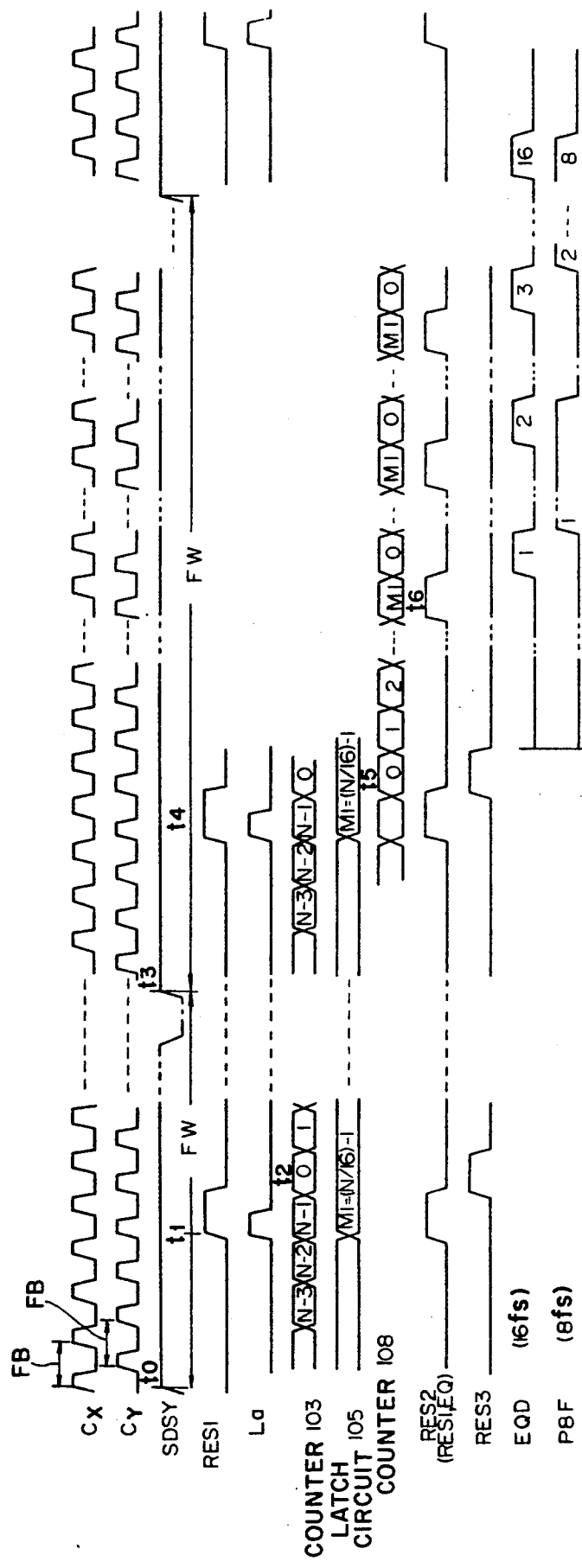
FIGS. 8 to 12 are time charts for explaining the operations of several parts of the digital filter.

FIG. 8 is the time chart for explaining the operation of the synchronizing signal generating portion 20. In this portion 20, the input word clock SDSY is delayed and its level is raised by a delay circuit 101, and then the SDSY is supplied to a detection circuit 102. When the word clock SDSY rises up at time t0, the detection circuit 102 outputs a leading detection pulse RES1 having the pulse width FB (where FB indicates the period of the clocks Cx, Cy) at the leading edge timing t1 of the third clock of Cy. This leading detection pulse RES1 is supplied to a counter 103 as the reset pulse.

The counter 103 is designed as the 8-bit up-counter having the synchronizing reset function, so that this counter 103 performs the count operation by the 2-phase clock Cx, Cy. In addition, a toggle-inhibit input TI of this counter 103 is fixed at voltage VDD. Therefore, this counter 103 continues to perform the up-count operation as long as the bit clock BCI is inputted thereto. At time t1 when the pulse RES1 is fed to the counter 103 as the reset pulse, this pulse is read by the counter 103 at the next clock timing of Cx. Then, the counter 103 is reset by the clock Cy, so that its count value is at "0" at time t2. Thereafter, the counter 103 starts to up-count its value from "0" in accordance with the bit clock BCI.

Meanwhile, the pulse RES1 outputted at time t1 is supplied to a latch circuit 105 via a differentiation circuit 104. As a result, the differentiation circuit 104 outputs a pulse La during the period FB/2 from the leading edge timing t1 of the pulse RES1. Such pulse La is supplied to the latch circuit 105 as a latch signal. Then, upper (i.e., leftmost) four bits Q4 to Q7 in the output data of the counter 103 are inputted into the latch circuit 105.

As described above, every time the leading edge of the word clock SDSY is detected, the counter 103 is reset and its last count value is inputted into the latch circuit 105. Herein, the bit clock rate is set at Nfs. In other words, the number of the bit clocks BCI to be inputted in one period FW of the word clock SDSY is set at N. In this case, the last count value just before the counter 103 is reset is at "N−1". Therefore, the value M1 indicative of the latch data of the latch circuit 105 can be obtained from the following formula (1).

$$M1 = (N/16) - 1 \qquad (1)$$

Such latch data M1 of the latch circuit 105 is supplied to a decoder 106 and a comparator circuit 107. The decoder 106 decodes the latch data M1 to thereby output bit clock rate detection signal SA, SB, SC. The present digital filter 2a can respond to certain bit clock rate which is 16-multiple of the frequency fs ranging from 32 fs to 192 fs, so that it can perform the timing control suitable for respective bit clock rate. This timing control is changed over by the bit clock rate detection signals SA, SB, SC. In this case, the signal SA is at "1" when the bit clock rate is equal to or over 128 fs, the signal SB is at "1" when the bit clock rate is between 48 fs and 112 fs, and the signal SC is at "1" when the bit clock rate is equal to 32 fs.

Meanwhile, the comparator circuit 107, a counter 108 and an OR gate 109 configures a variable frequency divider which divides the frequency of the bit clock BCI in accordance wit the latch data M1 of the latch circuit 105. Hereinafter, description will be given with respect to the operation of the variable frequency divider by using the time chart shown in FIG. 8. After the leading edge timing t3 of the word clock SDSY, the detection pulse RES1 is generated at time t4. This detection pulse RES1 is supplied to the counter 108 as a reset pulse RES2 via the OR gate 109. Then, the counter 108 inputs this reset pulse RES2 by the clock Cx which is generated just after RES2 is generated. This counter 108 is reset at the next clock Cy so that its count value is at "0" at time t5. Thereafter, the up-count operation of the counter 108 is performed from the count value "0" n accordance with the bit clock BCI.

The counter 108 proceeds its up-count operation every time the bit clock BCI is inputted thereto. Then, the count value of the counter 108 is compared to the latch data M1 of the latch circuit 105 by the comparator circuit 107. Thereafter, when the count value coincides with the latch data M1, the comparator circuit 107 outputs a detection pulse EQ, which is supplied to the counter 108 as the reset pulse RES2 at time t6. When the next clock Cy is inputted into the counter 108, the counter 108 is reset so that the up-count operation is repeated from the count value "0". As described above, the counter 108 performs the up-count operation in accordance with the latch data M1, so that the count value is repeated from "0" to "M1". Every time the count value coincides with "M1", the comparator circuit 107 outputs the detection signal EQ.

Therefore, the period FWEQ of the detection pulse EQ corresponds to "M1+1" clocks of BCI. In the case where the number of bit clocks to be inputted in one sampling period FW is at "N", the period FWEQ of the detection pulse EQ can be obtained from the following formula (2).

$$FWEQ=[(M1+1)/N]*FW \quad (2)$$

In this case, "M1" is given from the foregoing formula (1), so that FWEQ can be expressed as follows.

$$FWEQ=[(N/16)/N]*FW=FW/16 \quad (3)$$

As described above, the period FWEQ of the detection pulse EQ is one-sixteenth of the sampling period FW. Therefore, sixteen detection pulses EQ are generated in one sampling period FW. In other words, the frequency of EQ is equal to 16 fs.

In FIG. 5, 112 designates a 2-bit counter having the synchronizing reset function, which performs the up-count operation in accordance with the bit clock BCI. This counter 112 also has the toggle-inhibit function, so that it performs the up-count operation only while the toggle-inhibit signal TI is at "1". The foregoing detection pulse RES1 is generated at every leading edge timing of the word clock SDSY. This detection pulse RES1 is delayed by a delay circuit 110 and then supplied to the counter 112 as a reset pulse RES3. The counter 112 inputs this reset pulse RES3 at the leading edge timing of the clock Cx, so that the counter 112 is reset at next leading edge timing t7 of the clock Cy.

In addition, a pulse EQD is obtained by passing the pulse EQ through a delay circuit 111, and then this pulse EQD is supplied to the counter 112 as the toggle-inhibit signal. Therefore, every time the counter 112 inputs the pulse EQD, it performs the count operation. As a result, a pulse P8F whose frequency is a half of the pulse EQD is obtained from Q0 output of the counter 112. As described before, sixteen pulses EQD are generated in one sampling period FW. For this reason, as shown in FIG. 8, eight pulses P8F are generated in one sampling period FW. Thus, it is possible to obtain the pulse P8F having the frequency 8 fs.

Based on such pulse P8F, the output word clock WCO and sample/hold signals SHL, SHR are generated. Hereinafter, description will be given with respect to the operation of generating these signals by referring to the time chart shown in FIG. 9.

Generation of Word Clock WCO

Figure 9:
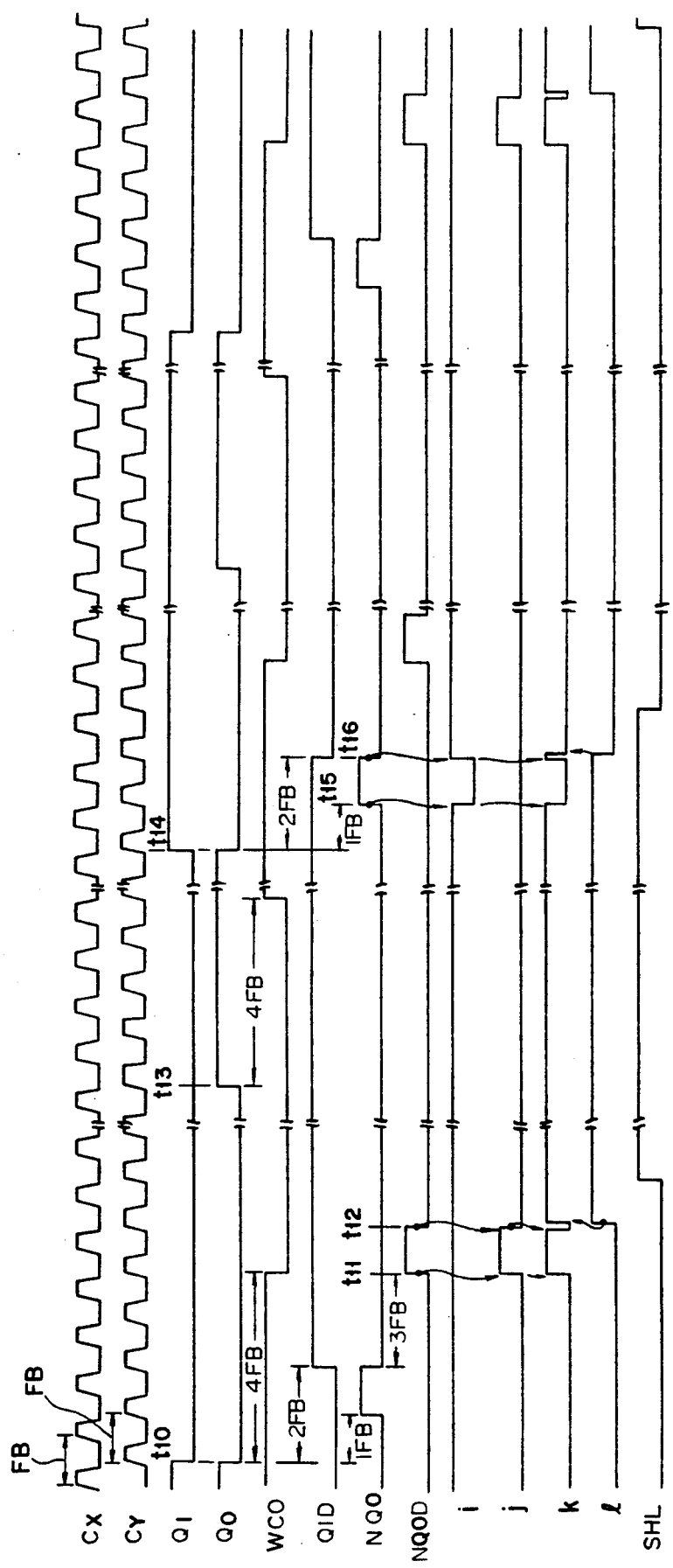

The pulse P8F is supplied to a delay circuit 114 and a selector 115 via a delay circuit 113. Then, the output of the selector 115 is to be outputted via a delay circuit 116 as the output word clock WCO. The foregoing bit clock rate detection signal SA is supplied to the selector 115 as its select signal, so that the delay time between output timings of P8F and WCO is changed over. Under operations of the circuits 113 to 116, the pulse P8F is delayed by 5 FB when the bit clock rate is equal to or over 128 fs, while it is delayed by 4 FB when the bit clock rate is equal to or below 112 fs. Then, such delayed pulse P8F is outputted as the word clock WCO. FIG. 9 shows the case where the bit clock rate is equal to or below 112 fs.

Generation of Sample/Hold signals SHL, SHR

In accordance with the change in the bit clock rate, the period FB of the bit clock rate is changed. For this reason, if the sample/hold signals SHL, SHR are generated by merely delaying the pulse P8F by the predetermined clocks, the changeover timing and pulse widths of the sample/hold signals SHL, SHR must be varied by the bit clock rate. Therefore, even if the sample/hold signal suitable for certain bit clock rate is obtained, the sample/hold timing thereof must be shifted off with respect to another bit clock rate, which will cause the malfunction of the system. In the present digital filter 2a, the sample/hold signals SHL, SHR are obtained by delaying the pulse P8F by the delay circuits. However, the stage number of the delay circuits are changed over in response to the bit clock rate. Thus, even if the bit clock rate is varied, it is possible to obtain the sample/hold signals SHL, SHR each having the desirable sample/hold timings.

Q1 output of the counter 112 is delayed by 2 FB by a delay circuit 117, and then the delayed output is inputted into a pulse generating circuit 118R as a signal Q1D. Further, an inverter 117a inverts this signal Q1D into a signal Q1DN, which is then inputted into another pulse generating circuit 118L. Meanwhile, the Q0 output (i.e., pulse P8F) of the counter 112 is inputted into a trailing detection circuit 119. At the trailing edge of the pulse P8F, this detection circuit 119 outputs a trailing detection pulse having the width FB. This trailing detection pulse is delayed by 1 FB by a delay circuit 120, and then the delayed detection pulse is outputted as a detection pulse NQO. This detection pulse NQO is inputted into the pulse generating circuits 118R, 118L, and it is also sequentially passed through delay circuits 121 to 123. Herein, both of the pulse generating circuits 118R, 118L have the same circuit configuration. The pulse generating circuit 118R is set in the enable state when the signal Q1D is at "1", while another pulse generating circuit 118L is set in the enable state when the signal Q1DN is at "1".

The outputs of the delay circuits 121 to 123 are inputted into a selector 124, to which the foregoing bit clock rate detection signals SA to SC are supplied as its select signals. Therefore, the output of the delay circuit 123 is selected when the bit clock rate is equal to or over 128 fs, the output of the delay circuit 122 is selected when the bit clock rate belongs to the range of 48 fs–112 fs, and the output of the delay circuit 121 is selected when the bit clock rate is equal to or below 32 fs. Then, the selected output of the above-mentioned delay circuit is supplied to the pulse generating circuits 18R, 118L as a pulse NQOD via a delay circuit 125.

Next, description will be given with respect to the operation of the pulse generating circuit 118L. When the period 1 FB is passed after the trailing edge timing t10 of the outputs Q0, Q1 of the counter 112, the pulse NQO is inputted into the pulse generating circuit 118L. At this time, the signal Q1DN is at "0", so that an output "i" of a NAND gate 118A is at "1", while another output "j" of an AND gate 118B is at "0". In addition, an output "k" of an OR-AND gate 118C is at the same level (i.e., "0" level) of an output "1" of a flip-flop 118D. Therefore, the output 1 of the pulse generating circuit 118L does not change.

In the case where the bit clock rate is in the range of 48 fs–112 fs, the leading edge timing of the pulse NQOD is delayed by 3 FB from that of the pulse NQO. As a result, the output j of the AND gate 118B and the output k of the OR-AND gate 118C are both at "1" at time t11. When 1 FB is passed after this time t11, the output j of the AND gate 118B rises up at time t12. Meanwhile, the output k (at "1" level) of the ORAND gate 118C is inputted into a flip-flop 118D by the clock Cx just before the time t12. Then, k is outputted from the flip-flop 118D at time t12. Therefore, the output k of the OR-AND gate 118C is finally set at "1". Thereafter, the output 1 of the pulse generating circuit 118L turns to be at "1" level. At the leading edge of this output 1, the selector 126, delay circuits 127L, 128L are sequentially activated so that the sample/hold signal SHL rises up. The delay time of this delay circuit 128L is set to 0.5 FB only in the case where the bit clock rate is equal to 32 fs and its input signal falls down. Similar thing can be said to another delay circuit 128R which will be described later.

Next, the Q0 output (i.e., pulse P8F) of the counter 112 rises up at time t13. In this case, the level of the word clock WCO is changed when 4 FB is passed after the time t13. During this period 4 FB, no operation is performed in the circuits concerning the generation of the sample/hold signal.

At next time t14, the Q0 output of the counter 112 falls down, but the Q1 output thereof rises up. When 1 FB is passed after this time t14, the pulse NQO rises up. When 2 FB is passed after this time t14, the pulse Q1DN falls down. At the leading edge timing t15 of the pulse NQO, the pulse Q1DN is at "1". Therefore, the output i of the NAND gate 118A falls down, and the output k of the OR-AND gate 118C also falls down. At next time t16 when 1 FB is passed after this time t15, the pulse NQO falls down so that the output i rises up. On the other hand, the output k (at "0" level) of the OR-AND gate 118C is inputted into the flip-flop 118D by the clock Cx just before the time t16. At time t16, k is outputted from the flip-flop 118D. As a result, the output k of the OR-AND gate 118C is finally set at "0". Thereafter, the output 1 of the pulse generating circuit 118L is at "0". When this output 1 falls down, the selector 126 and delay circuits 127L, 128L are sequentially activated, so that the sample/hold signal SHL falls down.

Similar thing can be said to another pulse generating circuit 118R, except that this circuit 118R operates during the "1" level period of the signal Q1D. Then, the output of the pulse generating circuit 118R is outputted as the sample/hold signal SHR via the delay circuits 127R, 128R.

In the case where the present digital filter 2a is used in the foregoing 1DAC-system, the change-over signal ST is fixed at "0". In this case, the selector 126 selects the output of the pulse generating circuit 118L. In addition, the output of the pulse generating circuit 118R is used as the sample/hold signal SHR, while the output of 118L is used as SHL. As shown in FIG. 3, these signals SHR, SHL alternatively rise up. In contrast, in the case where the present digital filter 2a is used in the foregoing 2DAC-system, the change-over signal ST is fixed at "1". In this case, the selector 126 selects the output of the OR gate 129. At this time, the outputs of the pulse generating circuits 118R, 118L are inputted into the OR gate 129. Therefore, the logical sum of the outputs of the pulse generating circuits 118L, 118R is outputted as the sample/hold signal SHL.

Next, description will be given with respect to the phase relation among the word clock WCO and sample/hold signals SHR, SHL in the digital filter 2a. As is apparent from the above description, it is possible to obtain the word clock WCO and sample/hold signals SHR, SHL having the following phase relations to the pulse P8F of the counter 112.

(a) The delay between the changing timings of P8F and WCO:

| (i) 128fs over | 5FB |
| (ii) 48fs–112fs | 4FB |
| (iii) 32fs | 4FB |

(b) The delay between the leading edge timings of P8F and SHR, SHL:

| (i) 128fs over | 9FB |
| (ii) 48fs–112fs | 6FB |
| (iii) 32fs | 5FB |

(c) The delay between the trailing edge timings of P8F and SHR, SHL:

| (i) 128fs over | 3FB |
| (ii) 48fs–112fs | 3FB |
| (iii) 32fs | 3.5FB |

Therefore, the phase relations between the word clock WCO and sample/hold signals SHR, SHL at each bit clock rate are as follows.

(d) The float time between the trailing edge timings of WCO and SHR, SHL (i.e., "2T" in FIG. 3):

| (i) 128fs over | 4FB |
|---|---|
| (ii) 48fs–112fs | 2FB |
| (iii) 32fs | 1FB |

(e) The float time between the trailing edge of SHR, SHL and next trailing edge of WCO (i.e., "T" in FIG. 3):

| (i) 128fs over | 2FB |
|---|---|
| (ii) 48fs–112fs | 1FB |
| (iii) 32fs | 0.5FB |

As described heretofore, the present digital filter $2a$ changes over the stage number of the delay circuits in accordance with the bit clock rate. Therefore, even if the bit clock rate is varied, the word clock WCO and sample/hold signals SHR, SHL can be sent out with desirable phase difference.

(2) BCO Generating Portion 19, Operation Control 18

The operation control 18 and BCO generating portion 19 are activated by the internal clocks C15, C16 which are asynchronous with the bit clock BCI. Every time the trailing edge of the output word clock WCO is detected, the operation control 18 and BCO generating portion 19 are activated.

The trailing edge of the word clock WCO is detected by a trailing detection circuit 201. This trailing detection circuit 201 generates a detection pulse RPA having a width t (where t indicates the period of the clocks C15, C16) at the first leading edge of the clock C16 after the trailing edge of the word clock WCO. This detection pulse RPA is passed through a jitter absorbing circuit 202 and then supplied to a BCO counter 203 within the BCO generating portion 19 as a reset pulse RP. This reset pulse RP is inputted into a BCO control circuit 204. In addition, this reset pulse RP is passed through a delay circuit 205 and then inputted into an address counter reset circuit 206. Incidentally, the operation of the jitter absorbing circuit 202 will be described later.

Next, description will be given with respect to the BCO generating portion 19. Herein, the BCO counter 203 is designed as the 6-bit up-counter which performs the up-count operation in accordance with the clocks C15, C16. The outputs Q0 to Q5 of this counter 203 are supplied to a decoder 207. When the count value of the counter 203 reaches at "33", "37", "44", "47", the decoder 207 outputs respective detection signals P33, P37, P44, P47 corresponding to these count values. When such count value is detected, the corresponding detection signal P33, P37, P44 is set at "1" but the detection signal P47 is set at "0". This detection signal P47 is inputted into the counter 203 as the toggle-inhibit signal.

At the trailing edge of the word clock WCO, the counter 203 is reset by the reset pulse RP. Then, this counter 203 counts up its count value from "0" in accordance with the clocks C15, C16 to be inputted thereto. When the count value reaches at "47", the decoder 207 outputs the detection signal P47. As a result, the counter 203 is subject to the toggle-inhibit state, whereby it does not perform the count operation even when the clocks C15, C16 are inputted thereto. Then, until the reset pulse RP is inputted into the counter 203 after the next trailing edge of the word clock WCO, the counter 203 holds its count value at "47".

Figure 10:
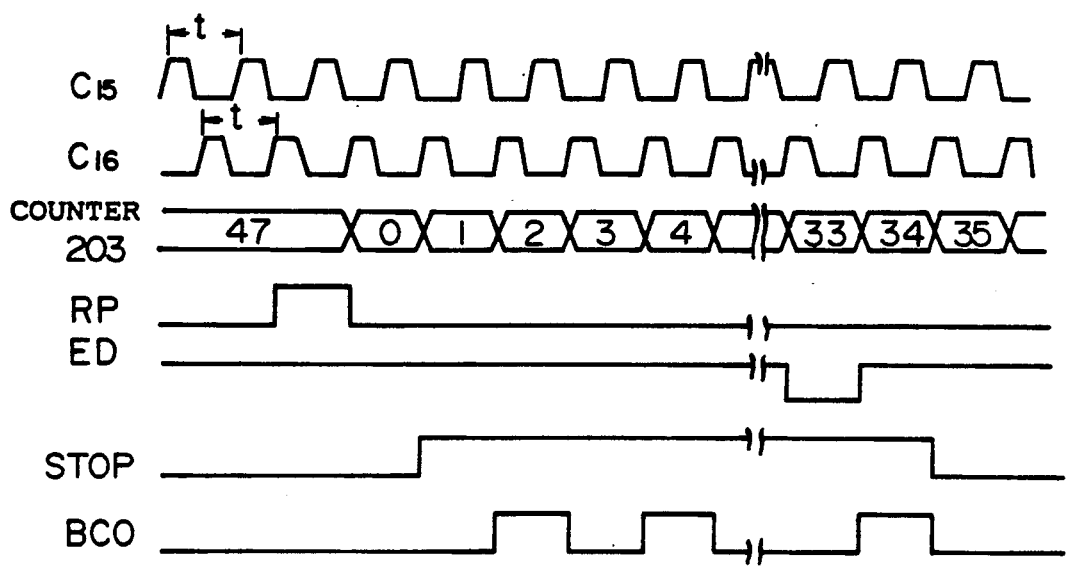

Meanwhile, the Q0 output of the counter 203 is delayed by 2t by a delay circuit 208, and then the delayed output thereof is supplied to a first input of an AND gate 211 via an inverter 210. In addition, a signal STOP outputted from the BCO control circuit 204 is supplied to a second input of the AND gate 211. Hereinafter, description will be given with respect to the operation of generating the bit clock BCO in the BCO generating portion by referring to the time chart shown in FIG. 10. The counter 203 is reset at the next clock C16 after the reset pulse RP is supplied thereto. In addition, this reset pulse RP is read by the BCO control circuit 204, so that the signal STOP rises up when the delay time 2t has been passed after the leading edge timing of the reset pulse RP. This stands by the operation of sending the bit clock BCO. Then, the Q0 output of the counter 203 is outputted as the bit clock BCO via the delay circuit 208, inverter 210 and AND gate 211.

In the case where the change-over signal (16/18) is set at "0", the detection signal P33 is supplied to the BCO control circuit 204 as an end signal ED via a selector 212 when the count value of the counter 203 reaches at "33". As a result, the signal STOP falls down when the delay time 2t has been passed after the leading edge timing of the end signal ED. Thereafter, the transmission of the bit clock BCO is stopped. On the other hand, in the case where the change-over signal (16/18) is set at "1", the transmission of the bit clock BCO is stopped when the count value "37" is detected. As described above, every time the word clock WCO falls down, the BCO generating portion 19 outputs the bit clock BCO.

Next, description will be given with respect to the operation control 18. In FIG. 5, 213 designates an address counter which is designed as the 8 bit up-counter, whose outputs Q0 to Q7 are supplied to a micro program ROM (not shown) as the micro program address. 209 designates a clock generating circuit which generates the 2-phase clock C1, C2 based on the Q0 output of the counter 203 within the BCO generating portion 19. Then, the address counter 213 performs the count operation by the clocks C1, C2. 214 designates a decoder which outputs a detection signal P191 when the count value of the address counter 213 reaches at "191". This detection signal P191 is supplied to the address counter 213 as the reset signal via an OR gate 215. Then, the address counter 213 is reset by the timing of the clock C2 after the reset signal is supplied thereto. As a result, address counter 213 repeatedly counts up its count value from "0" to "191" in accordance with the clocks C1, C2.

Figure 11:
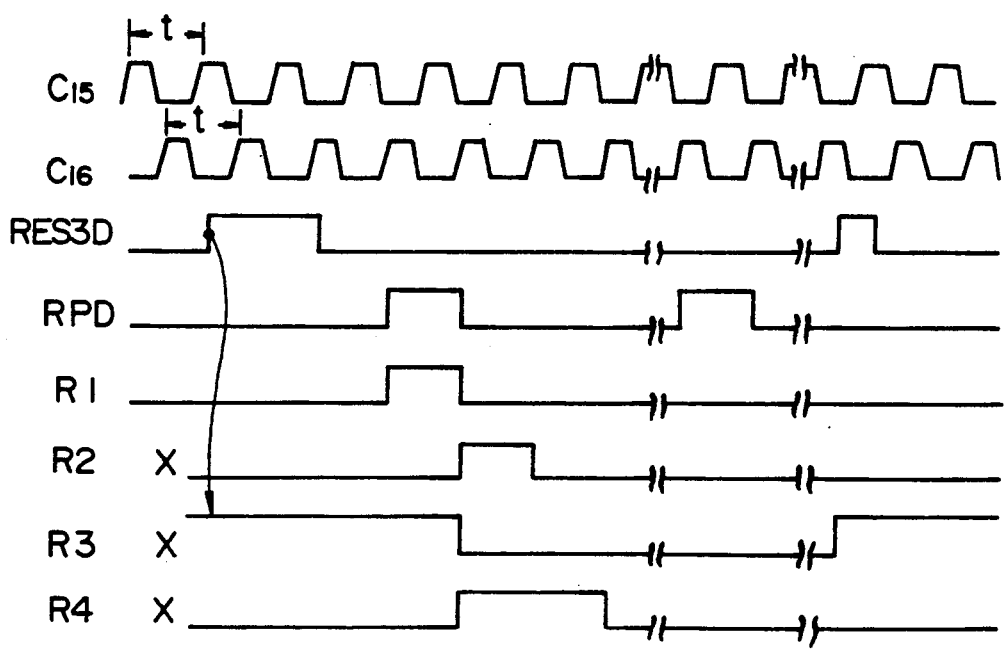

In addition, the address counter 213 is reset at the first trailing edge of the word clock WCO within the sampling period FW. FIG. 11 shows the time chart indicating the operation of the address counter reset circuit 206. When the sampling period FW is started at the leading edge of the input word clock SDSY, a detection pulse RES3D is supplied to the address counter reset circuit 206. As a result, a set-reset flip-flop (i.e., S-R or R-S flip-flop) 206A is set, so that its output signal R3 is set at "1". When a detection pulse RPD is supplied to the AND gate 206B after the trailing edge of the output word clock WCO, an output signal R1 of this AND gate 206B is turned at "1". This signal R1 is outputted as a signal R4 via an OR gate 206C and a flip-flop 206D. This signal R4 resets the address counter 213. In addition, the signal R1 is read by a flip-flop 206E, from which it is outputted as a signal R2. As a result, this signal R2 resets the S-R flip-flop 206A so that its output signal R3 is turned at "0". Thereafter, even if the detection pulse RPD is supplied to the circuit 206 after the trailing edge of the word clock WCO, the reset pulse is not supplied to the address counter 213. As described above, at the first trailing edge timing of the word clock WCO in the sampling period FW, the address counter 213 is reset. Thereafter, the address counter 213 performs the count operation in accordance with the clocks C1, C2.

As described before, the clocks C1, C2 are generated based on the Q0 output of the counter 203. Every time the word clock WCO falls down, the counter 203 repeats its count value to be varied from "0" to "47". Therefore, every time the word clock WCO falls down, twelve sets of the clocks C1, C2 are generated, by which the address counter 213 proceeds its count operation. Then, when the address counter 213 sends out the micro program address, the operation unit 12 (see FIG. 1) executes the arithmetic operation based on the corresponding micro program. Thus, every time the word clock WCO falls down, twelve steps of micro programs are to be executed in synchronism with the clocks C1, C2. After the twelve steps of the micro programs are completed, the address counter 213 terminates its count operation so that the operation unit 12 is set in the standby state until the next trailing edge of the word clock WCO. In one sampling period FW, there are eight trailing edges of the word clock WCO. Therefore, in one sampling period FW, total 192 steps of micro programs are executed.

As described above, the present digital filter 2a executes its arithmetic operation in synchronism with the clocks C15, C16 which are asynchronous with the bit clock BCI. In addition, at every trailing edge of the word clock WCO, the predetermined steps of the micro programs are executed. Therefore the present digital filter 2a can respond to several kinds of sampling periods. Further, the present digital filter 2a proceeds its operation by the speed corresponding to the frequency of the clocks C15, C16. After executing the operation, the digital filter 2a is set in the standby state until the next trailing edge of the word clock WCO. Thus, it is possible to increase the frequency of the clocks C15, C16 beyond the allowable frequency range by certain degree.

Next, description will be given with respect to the operation of the jitter absorbing circuit 202. In the present digital filter 2a, the lower limit of the frequency of the clocks C15, C16 is set at 384 fs. However, when this clock frequency enters into the vicinity of this limit 384 fs, the operation speed of the digital filter 2a falls down. This causes the disadvantage in that the next trailing edge of the word clock WCO is occurred before the preceding operation is not completed. For example, the detection pulse RPA is generated at the trailing edge of the word clock WCO, but the preceding operation has not been completed. In this case, the detection pulse RPA is delayed, and then it will be outputted as the detection pulse RP after the preceding operation is completed.

Figure 12:
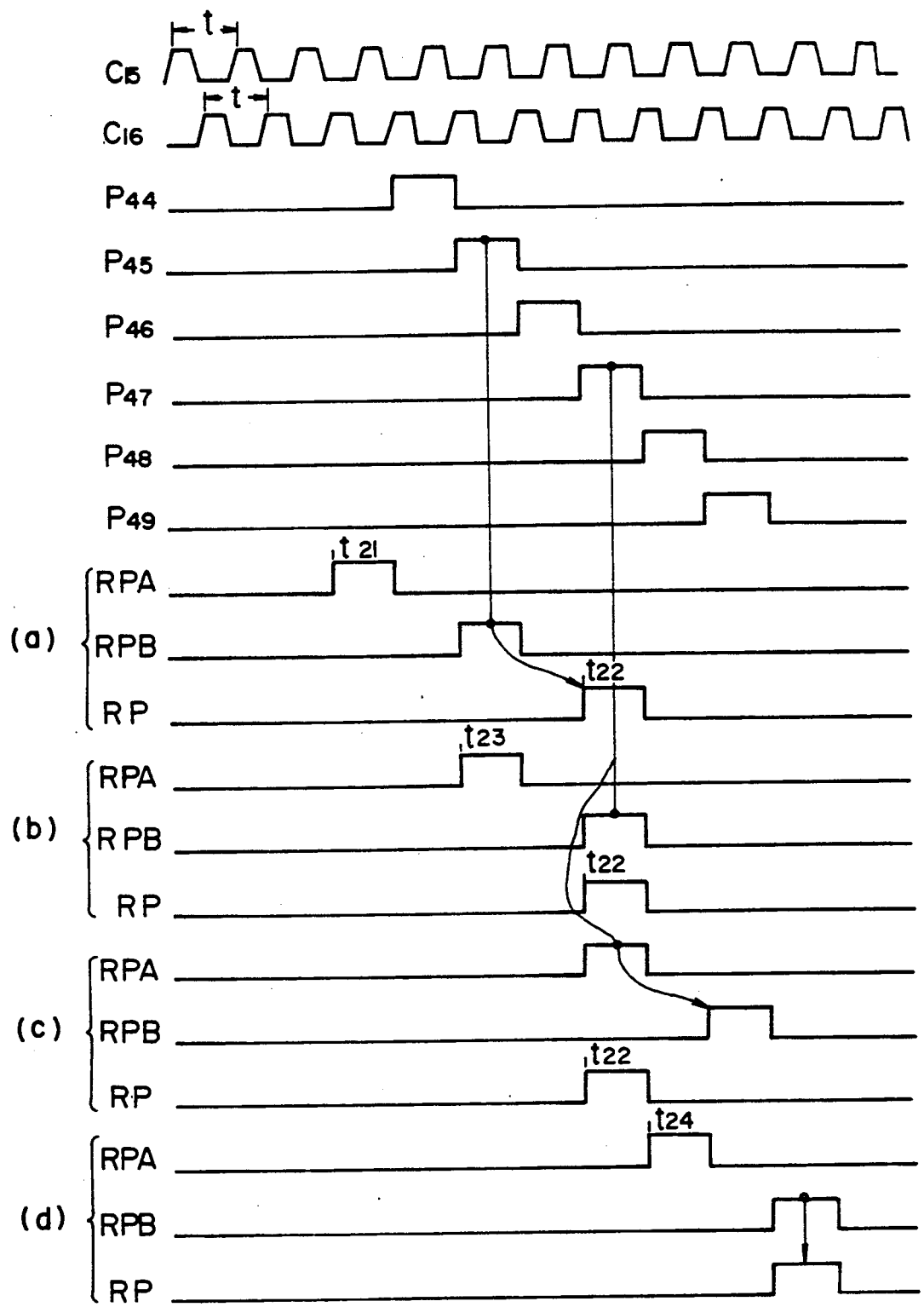

FIG. 12 is the time chart showing the operation of the jitter absorbing circuit 202. When the count value of the counter 203 in the BCO generating portion 19 reaches at "44", the counter 203 outputs the detection signal P44. This detection signal P44 is sequentially transmitted through delay circuits D45 to D49 in accordance with the clocks C15, C16. As described before, the signal P44 is at "1" when the count value of the counter 203 is at "44", and the signal P45 is at "1" when the count value is at "45". In this manner, the signals P44 to P49 sequentially rise up. Then, when the time 1t has passed after the leading edge timing of each detection signal, each detection signal falls down.

In the case as shown in FIG. 12(a), at time t21 when the count value of the counter 203 reaches at "43" and the detection pulse RPA is generated, this detection pulse RPA sequentially passes through delay circuits D50, D51, AND gate 202A, delay circuit 202B and OR gate 202X. Then, at time t22 when the count value of the counter 203 reaches at "47", this detection pulse RPA is outputted as the pulse RP. In the case as shown in FIG. 12(b), at time t23 when the count value of the counter 203 reaches at "45" and the detection pulse RPA is generated, this detection pulse RPA sequentially passes through the delay circuits D50, D51, AND gate 202C and OR gate 202X. Then, at time t22, RPA is outputted as RP. Further, in the case as shown in FIG. 12(c), at time t22 when the count value of the counter 203 reaches at "47" and RPA is generated, RPA is outputted as RP via an AND gate 202D. Furthermore, in the case as shown in FIG. 12(d), at time t24 when RPA is generated after the counter 203 completes its count operation, RPA is outputted as RP via the delay circuits D50, D51, inverter 202E, NOR gate 202Y and OR gate 202X. As described above, in response to the count value of the counter 203, i.e., the proceeding state of the preceding operation at the timing when the detection pulse RPA is generated, this detection pulse RPA is delayed and then supplied to the BCO generating portion 19 as the pulse RP.

The above is the description of the preferred embodiment of the present invention. This invention may be practiced or embodied in still other ways without departing from the spirit or essential character thereof. Therefore, the preferred embodiment described herein is illustrative and not restrictive, the scope of the invention being indicated by the appended claims and all variations which come within the meaning of the claims are intended to be embraced therein.

What is claimed is:

1. A digital signal processing circuit comprising:
   (a) operation means for performing a specified number of operation processes during a predetermined sampling period;
   (b) detecting means for detecting an input signal indicative of said predetermined sampling period, and for initiating performance of said operation processes by said operation means; and
   (c) control means responsive to said detecting means, and communicable with said operation means for terminating performance of said operation processes by said operation means when said specified number of operation processes is completed.

2. A digital filter comprising:
   (a) means for performing a predetermined arithmetic operation having a predetermined step number, on time series inputted digital data during a predetermined first sampling period to generate output digital data corresponding to a second sampling frequency which is N (where N is an integer) times larger than a predetermined first sampling frequency corresponding to said first sampling period;

(b) a synchronizing signal generating means for generating a synchronizing signal having said second sampling frequency in response to said predetermined first sampling period of said inputted digital data; and (c) an operation control means activated by an internal clock which is asynchronous with said inputted digital data, for initiating operation processes in response to said synchronizing signal generated by said synchronizing signal generating means, said operation control means terminating said operation processes upon a completion of said predetermined step number.

3. A digital filter comprising:

(a) means for performing an arithmetic operation on time-series inputted digital data during a predetermined first sampling period to generate output digital data synchronous with a second sampling frequency which is N (where N is an integer) times larger than a predetermined first sampling frequency corresponding to said first sampling period;

a timing generating means for detecting said first sampling period of said inputted digital data to thereby generate a start signal having said second sampling frequency;

(c) a detecting means for detecting a bit input rate of each bit within said input digital data; and (d) an output means responsive to said start signal generated by said timing generating means, for outputting said output digital data generated by said arithmetic operation performing means and for controlling timing of said outputting in response to said bit input rate.

4. A digital filter comprising:

(a) serial-to-parallel converting means for converting first serial data inputted thereto into first parallel data, said first serial data having a predetermined sampling frequency;

(b) synchronizing signal generating means for generating a synchronizing signal having a frequency N times (where N is an integer) larger than said predetermined sampling frequency based on said first serial data;

(c) operation means responsive to a clock which is asynchronous with said first serial data, for operating upon said first parallel data with a corresponding coefficient to thereby generate second parallel data indicative of an operation result in response to said synchronizing signal; and (d) parallel-to-serial converting means for converting said second parallel data into second serial data corresponding to said frequency which is N times larger than said predetermined sampling frequency.

5. A digital filter according to claim 4 further comprising:

bit clock generating means for generating and transmitting bit clocks to said parallel-to-serial converting means so that bits of said second serial data are outputted from said parallel-to-serial means based on said bit clocks, wherein a number of said bit clocks is responsive to a change-over signal transmitted thereto such that a bit number of said second serial data can be changed with reference to said first serial data by adding one or more extension bits obtained from said operation means to said second parallel data.

* * * * *